United States Patent
Chou et al.

(10) Patent No.: US 9,728,533 B2
(45) Date of Patent: Aug. 8, 2017

(54) AQUEOUS CLEANING TECHNIQUES AND COMPOSITIONS FOR USE IN SEMICONDUCTOR DEVICE MANUFACTURE

(71) Applicant: Taiwan Semiconductor Manufacturing Co., Ltd., Hsin-Chu (TW)

(72) Inventors: Chun-Li Chou, Jhubei (TW); Shao-Yen Ku, Jhubei (TW); Pei-Hung Chen, Hsinchu (TW); Jui-Ping Chuang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/578,746

(22) Filed: Dec. 22, 2014

(65) Prior Publication Data
US 2015/0108578 A1 Apr. 23, 2015

Related U.S. Application Data

(63) Continuation of application No. 13/459,379, filed on Apr. 30, 2012, now Pat. No. 8,916,429.

(51) Int. Cl.
*H01L 29/78* (2006.01)
*H01L 27/088* (2006.01)
(Continued)

(52) U.S. Cl.
CPC .......... *H01L 27/088* (2013.01); *C11D 7/3209* (2013.01); *C11D 7/3281* (2013.01);
(Continued)

(58) Field of Classification Search
CPC ..... H01L 27/088; H01L 27/092; H01L 29/78; H01L 29/06; H01L 29/778; H01L 29/0653; H01L 29/6659; H01L 29/7842; H01L 29/165; H01L 29/66583; H01L 29/66636; H01L 29/7833; H01L 29/7848
(Continued)

(56) References Cited

U.S. PATENT DOCUMENTS 6,489,191 B2 12/2002 Shao et al.
6,864,193 B2 3/2005 Chou et al.
(Continued)

OTHER PUBLICATIONS

Non-Final Office Action dated Oct. 18, 2013 for U.S. Appl. No. 13/459,379.
(Continued)

*Primary Examiner* — Chuong A Luu
(74) *Attorney, Agent, or Firm* — Eschweiler & Potashnik, LLC

(57) ABSTRACT

Some embodiments relate to a manufacturing method for a semiconductor device. In this method, a semiconductor workpiece, which includes a metal gate electrode thereon, is provided. An opening is formed in the semiconductor workpiece to expose a surface of the metal gate. Formation of the opening leaves a polymeric residue on the workpiece. To remove the polymeric residue from the workpiece, a cleaning solution that includes an organic alkali component is used. Other embodiments related to a semiconductor device resulting from the method.

20 Claims, 5 Drawing Sheets

(51) Int. Cl.

| | | |
|---|---|---|
| *C11D 7/32* | (2006.01) | |
| *C11D 7/34* | (2006.01) | |
| *C11D 11/00* | (2006.01) | |
| *H01L 21/8238* | (2006.01) | |
| *H01L 21/02* | (2006.01) | |
| *H01L 27/092* | (2006.01) | |
| *H01L 29/06* | (2006.01) | |
| *H01L 29/66* | (2006.01) | |
| *H01L 29/165* | (2006.01) | |

(52) U.S. Cl.
CPC ............ *C11D 7/34* (2013.01); *C11D 11/0047* (2013.01); *H01L 21/02063* (2013.01); *H01L 21/823814* (2013.01); *H01L 21/823828* (2013.01); *H01L 27/092* (2013.01); *H01L 29/0653* (2013.01); *H01L 29/6659* (2013.01); *H01L 29/7842* (2013.01); *H01L 29/165* (2013.01); *H01L 29/66583* (2013.01); *H01L 29/66636* (2013.01); *H01L 29/7833* (2013.01); *H01L 29/7848* (2013.01)

(58) Field of Classification Search
USPC .................................................. 257/368, 369
See application file for complete search history.

(56) References Cited

U.S. PATENT DOCUMENTS

| | | | |
|---|---|---|---|
| 7,022,610 B2 | 4/2006 | Chou et al. | |
| 7,621,281 B2 | 11/2009 | Ikemoto et al. | |
| 7,719,060 B2 | 5/2010 | Wei et al. | |
| 7,943,562 B2 | 5/2011 | Lee et al. | |
| 7,968,506 B2 | 6/2011 | Chou et al. | |
| 2002/0123191 A1 | 9/2002 | Huang et al. | |
| 2005/0197265 A1 | 9/2005 | Rath et al. | |
| 2005/0285173 A1* | 12/2005 | Nagai | H01L 21/02063 257/296 |
| 2006/0287208 A1 | 12/2006 | Lee et al. | |
| 2008/0051313 A1 | 2/2008 | Lee et al. | |
| 2008/0311711 A1 | 12/2008 | Hampp et al. | |
| 2009/0014796 A1* | 1/2009 | Liaw | H01L 27/11 257/347 |
| 2010/0055897 A1 | 3/2010 | Chou et al. | |
| 2011/0260258 A1* | 10/2011 | Zhu | H01L 21/823807 257/369 |
| 2012/0156867 A1* | 6/2012 | Jeong | H01L 21/76897 438/586 |
| 2012/0306023 A1* | 12/2012 | Ma | H01L 21/76816 257/401 |
| 2012/0306026 A1* | 12/2012 | Guo | H01L 29/495 257/407 |

OTHER PUBLICATIONS

Final Office Action dated May 14, 2014 for U.S. Appl. No. 13/459,379.
Notice of Allowance dated Aug. 18, 2014 for U.S. Appl. No. 13/459,379.

* cited by examiner

AQUEOUS CLEANING TECHNIQUES AND COMPOSITIONS FOR USE IN SEMICONDUCTOR DEVICE MANUFACTURE

REFERENCE TO RELATED APPLICATION

This Application is a continuation of U.S. application Ser. No. 13/459,379, filed on Apr. 30, 2012 now U.S. Pat. No. 8,916,429.

BACKGROUND

Integrated circuit chips frequently utilize multiple levels of patterned conductive layers to provide electrical interconnects between semiconductor devices within a semiconductor substrate. The present disclosure relates to improved cleaning techniques and cleaning compositions used in manufacturing semiconductor devices.

DETAILED DESCRIPTION

Figure 1:
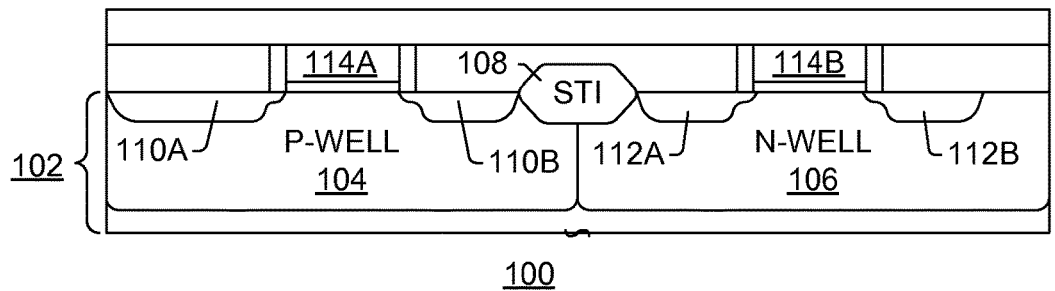
FIGS. 1-3 are cross-sectional diagrams illustrating a method of forming a semiconductor device that suffers from some shortcomings.

The invention will now be described with reference to the attached drawings, wherein like reference numerals are used to refer to like elements throughout.

Figure 2:
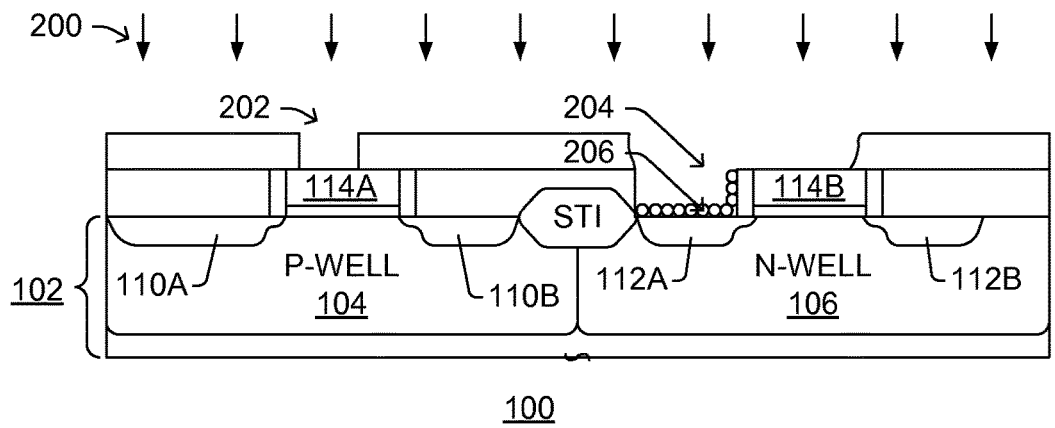
Figure 3:
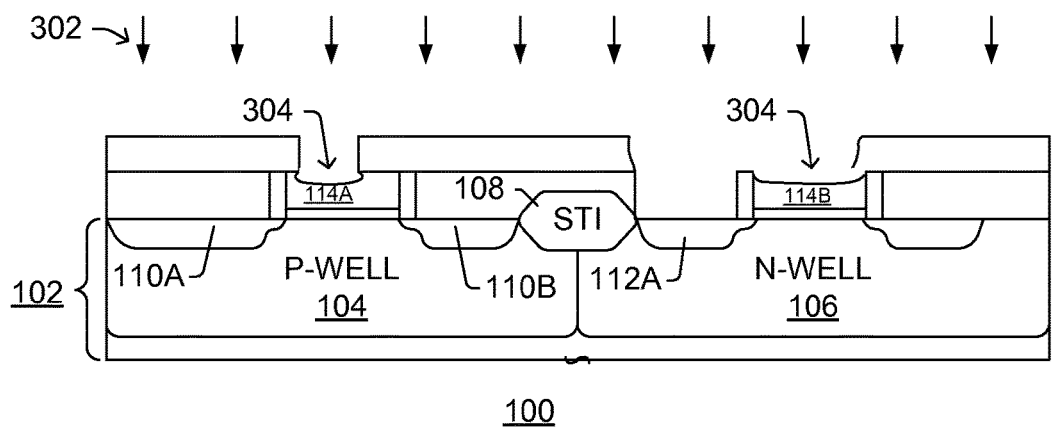

FIGS. 1-3 show a series of cross-sectional views that illustrate a method of forming a semiconductor device that suffers from some shortcomings. In FIG. 1, a workpiece 100 that includes a silicon substrate 102 is provided. The substrate includes gate electrodes 114A, 114B and source/drain regions 110A/B, 112A/B.

To form an electrical connection to gate electrode 114A and source/drain region 112A, one or more etches 200 are performed to form openings 202 and 204, as shown in FIG. 2. Unfortunately, however, these one or more etches 200 can leave a polymeric etch residue 206 along the sidewalls and bottom of opening 204. This polymeric etch residue 206 can cause a subsequently formed source/drain contact formed in opening 204 to exhibit a higher resistance than expected (e.g., to be a non-ohmic contact), and can thus lead to problems during device operation.

To remove this polymeric etch residue 206, conventional methods have attempted to use a diluted ammonium peroxide mixture (DAPM) cleaning solution 302, as shown in FIG. 3. Although the DAPM solution 302 removes the polymeric etch residue 206, it also causes "dishing" 304 for the gate electrodes 114A, 114B. This dishing 304 can cause electrical contact problems for the gate electrodes, and therefore is less than ideal. In view of these shortcomings, the present disclosure provides for improved cleaning techniques for semiconductor devices.

Figure 4:
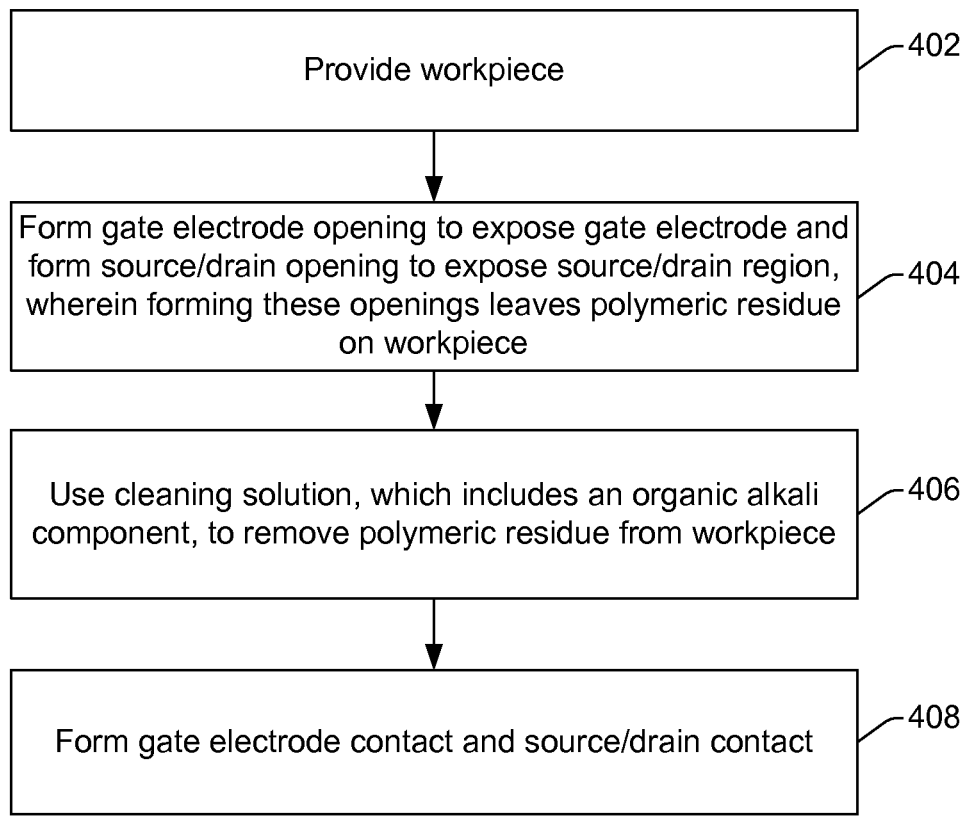
FIG. 4 is an exemplary method of forming a semiconductor device in accordance with some embodiments.

An exemplary method is shown in FIG. 4. In 402, a semiconductor workpiece having is provided. In 404, a gate electrode opening is formed to expose a gate electrode on workpiece. A source/drain opening is also formed to concurrently expose a source/drain region. Unfortunately, forming these openings leaves polymeric residue on workpiece. To remove the polymeric residue, in 406, an aqueous cleaning solution, which includes an organic alkali component rather than DAPM, is applied to the workpiece.

The aqueous cleaning composition can include a) an organic alkali, b) an acid additive, c) an azole, and d) water. The aqueous cleaning composition limits or eliminates damage to the gate electrodes and removes any remaining polymeric residue left following one or more etch steps. In some embodiments, the pH of the composition is from about 7 to about 10. The components of the aqueous cleaning composition can be of any suitable type of species. Specific illustrative formulation components for each of the ingredients of the composition are described below.

In one embodiment, the organic alkali component includes one or more of of 4-methoxypyridine-N-oxide hydrate, 4-methylmorpholine N-oxide monohydrate, ethanol 2-(dimethylamino)-N-oxide, trimethylamine N-oxide, and tetrahydrothiphene-1,1-dioxide. A quantity of the organic alkali component of the composition is in the range from about 0.01% to 50%.

In one embodiment, the acid additive includes one or more of tetramethylammonium fluoride, tetraethylammonium fluoride hydrate, tetrabutylammonium fluoride, ammonium sulfate, hydroxylammonium sulfate, and methyl hypochlorite. A quantity of the acid additive is in a range from about 0.01% to 5%.

In one embodiment, the azole includes one or more of imidazole, 1H-tetrazole, 1,2,3-1H-triazole, and 1,2,4-1H-triazole. The azole acts as a chelating agent that binds with and inhibits corrosion of metal layers (e.g., aluminum metal layers) being cleaned. A quantity of the azole in the composition is in a range from about 0.01% to 5% by weight of the total composition.

In 408, after the polymeric residue has been removed by the cleaning solution, a gate electrode contact and source/drain contact are formed. These contacts are physically coupled to the gate electrode and source/drain region, respectively (e.g., to an upper surface of the gate electrode and source/drain, respectively). Because the polymeric residue has been removed prior to the formation of these contacts, these contacts are typically ohmic contacts. Hence, FIG. 4's method promotes desired electrical characteristics for semiconductor devices.

FIGS. 5-13 show a series of cross-sectional views illustrating an exemplary method of forming a semiconductor device. For purposes of understanding and clarity, this series of cross-sectional views has been streamlined in that other embodiments may include additional steps, and not all illustrated steps are present in all manufacturing flows. Hence, any number of variations are contemplated as falling within the scope of the present disclosure, and the disclosure is not limited to the examples illustrated or described herein.

Figure 5:
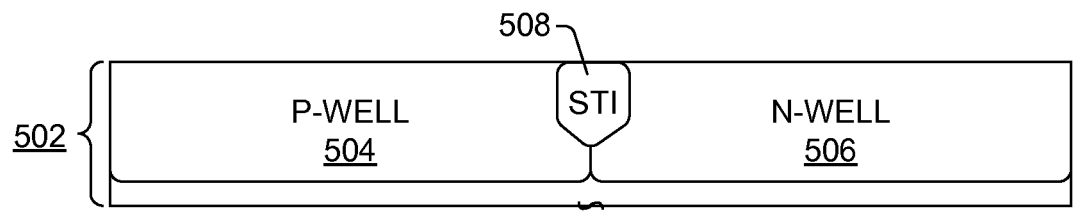
FIGS. 5-13 are cross-sectional diagrams illustrating a method of forming a semiconductor device in accordance with an exemplary embodiment described herein.

Turning to FIG. 5, a substrate 502 is provided in the form of a bulk silicon wafer. A p-well 504 and n-well 506 are formed in the substrate 502, and shallow trench isolation (STI) region 508 is formed between the p-well 504 and n-well 506. Although FIG. 5 illustrates a bulk silicon wafer substrate, "semiconductor substrate" as referred to herein may comprise any type of semiconductor material including a bulk silicon wafer, a binary compound substrate (e.g., GaAs wafer), a ternary compound substrate (e.g., AlGaAs), or higher order compound wafers, among others. Further, the semiconductor substrate 502 can also include non semiconductor materials such as oxide in silicon-on-insulator (SOI), partial SOI substrate, polysilicon, amorphous silicon, or organic materials, among others. In some embodiments, the semiconductor substrate 206 can also include multiple wafers or dies which are stacked or otherwise adhered together. The semiconductor substrate 502 can include wafers which are cut from a silicon ingot, and/or any other type of semiconductor/non-semiconductor and/or deposited or grown (e.g. epitaxial) layers formed on an underlying substrate.

Figure 6:
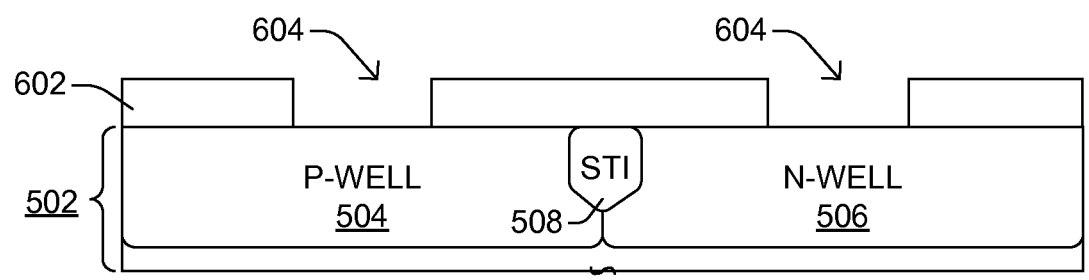

In FIG. 6, a first dielectric layer 602, which can comprise a polysilicate glass (PSG) in some embodiments, is formed on an upper surface of substrate 502. A photomask (not shown) is patterned over the first dielectric layer 602 and an etch is carried out with the photomask in place to form first dielectric layer openings 604, 606.

Figure 7:
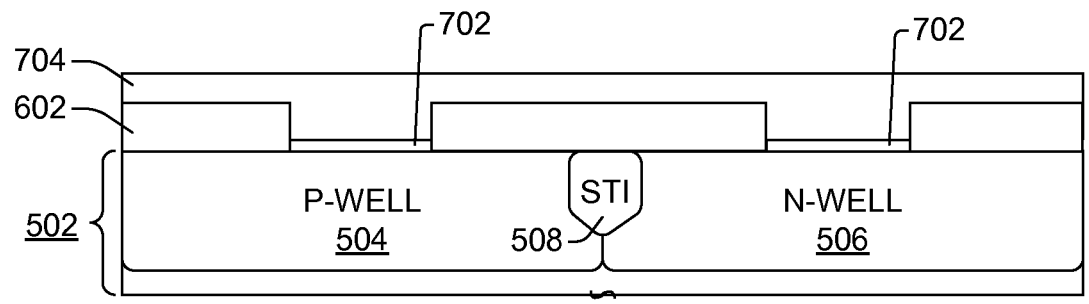

In FIG. 7, a relatively thin gate oxide layer 702 is formed on the exposed substrate surfaces in the openings 604, 606. A gate electrode layer 704 is then formed over the workpiece. The gate electrode layer 704 often comprises aluminum, but could also comprise other metals, for example, copper or tungsten in various embodiments.

Figure 8:
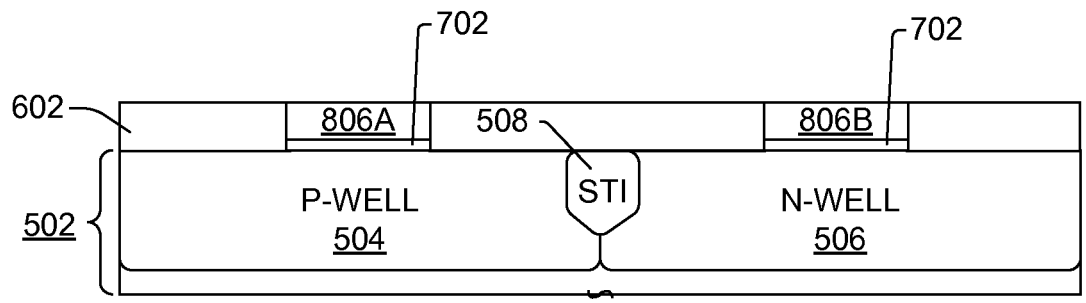

In FIG. 8, chemical mechanical polishing (CMP) has been carried out to planarize the gate electrode layer 704, thereby forming gate electrodes 806A, 806B.

Figure 9:
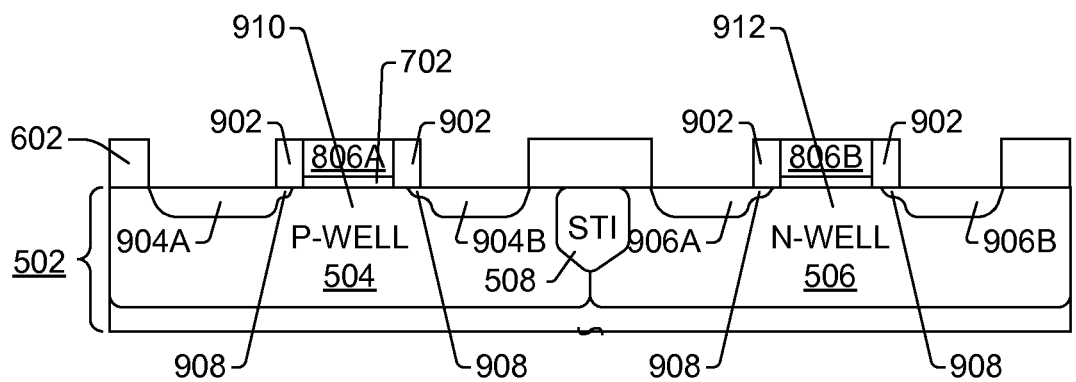

In FIG. 9, sidewall spacers 902 are formed on the sidewalls of the gate electrodes. N-type source and drain regions 904A, 904B are formed in the p-well 504, and p-type source and drain regions 906A, 906B are formed in the n-well 506. To form the n-type source and drain regions 904A, 904B, a n-implant mask is typically formed over the n-well 506, and n-type dopants are implanted into the substrate 502. Similarly, to form the p-type source and drain regions 906A, 906B, the n-implant mask is removed, and a p-implant mask is formed over the p-well 504. With the p-implant mask in place, p-type dopants are implanted into the substrate 502. Angled implants can also be used to form source drain extension regions 908, which extend under the lateral edges of the gate electrodes. Thus, a NMOS channel region 910 is formed in p-well under gate electrode 806A, and a PMOS channel region 912 is formed in n-well under gate electrode 806B.

Figure 10:
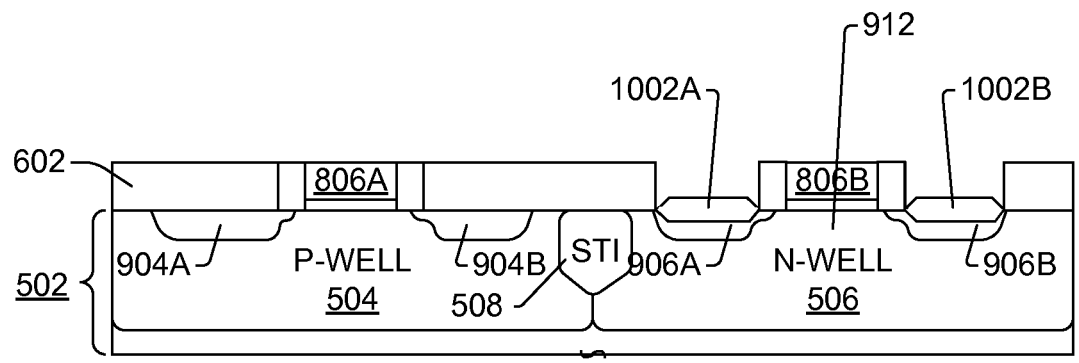
Figure 11:
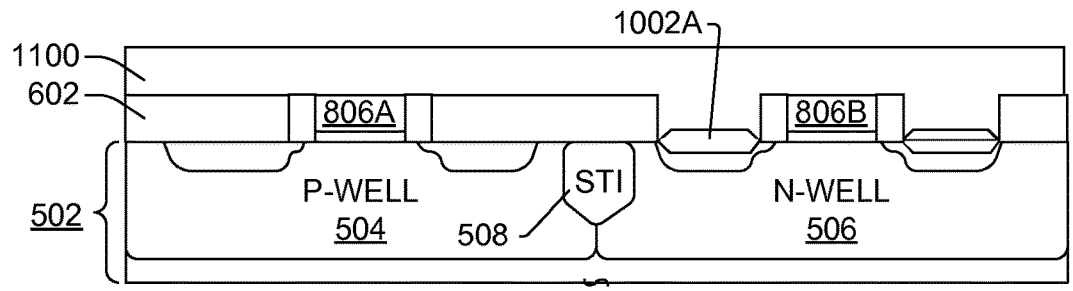

In FIG. 10, strain inducing regions 1002A, 1002B are formed near the p-type source and drain regions 906A, 906B. In some embodiments, these strain inducing regions 1002A, 1002B can comprise Silicon germanium (SiGe). Lattice mismatch between the strain inducing regions 1002A, 1002B and surrounding silicon substrate 502 induces strain in PMOS channel region 912, thereby increasing mobility of carriers in the PMOS channel region 912 during device operation. Strain inducing materials other than SeGe could also be used In FIG. 11, a second dielectric layer 1100, which is made of polysilicate glass (PSG) in some embodiments, is disposed around the gate electrodes 806A, 806B.

Figure 12:
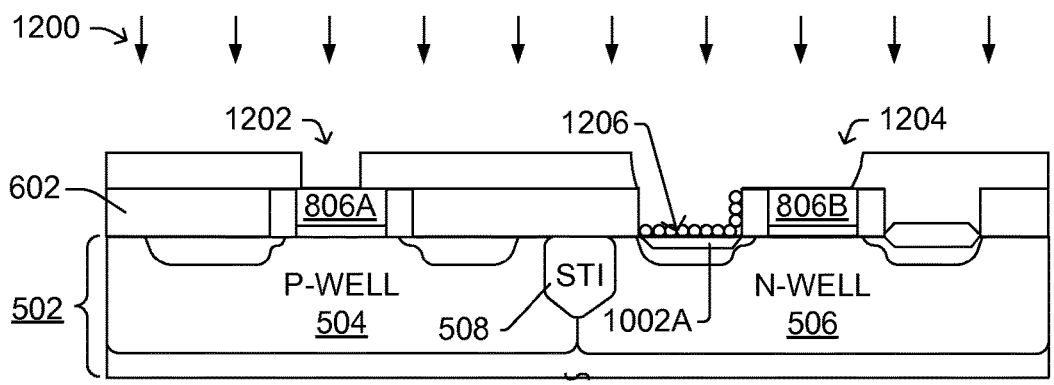

In FIG. 12 one or more etches 1200 are performed to form openings 1202 and 1204 in the NMOS and PMOS regions, respectively. Although the etches 1200 are sufficient to form these openings 1202, 1204 as desired, the etches, however, leave a polymeric etch residue 1206 along the sidewalls and bottom of opening 1204.

Figure 13:

To remove this polymeric etch residue 1206, FIG. 13 shows a cleaning composition 1300, which includes an organic alkali component being applied. The aqueous cleaning composition 1300 can include a) an organic alkali, b) an acid additive, c) an azole, and d) water. The cleaning composition 1300 limits or prevents damage to the gate electrodes 806A, 806B and removes any remaining polymer residue left following the one or more etch steps. Hence, the illustrated method promotes desired electrical characteristics for semiconductor devices.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A semiconductor device comprising:
    a substrate having a first source/drain region laterally spaced from a second source/drain region on opposing sides of a channel region;
    a gate electrode arranged over the channel region and having a top surface free of dishing;
    a first dielectric layer arranged over the first and second source/drain regions and having a top surface approximately coplanar with the top surface of the gate electrode;
    a second dielectric layer arranged over the first dielectric layer and the gate electrode, wherein a bottom surface of the second dielectric layer is below the top surface of the gate electrode;
    a conductive contact extending through the first and second dielectric layers to the first source/drain region and ohmically coupled to the first source/drain region; and
    a first strain inducing region and a second strain inducing region arranged over and contacting respective ones of the first and second source/drain regions, wherein a top surface of the second strain inducing region is spaced over a top surface of the first strain inducing region.

2. The semiconductor device according to claim 1, wherein the substrate includes a first doped well region neighboring a second doped well region with a different doping type than the first doped well region, wherein the first and second source/drain regions are arranged in the first doped well region, and wherein the semiconductor device further includes:
    a third source/drain region laterally spaced from a fourth source/drain region in the second doped well region on opposing sides of a second channel region;
    a second gate electrode arranged over the second channel region, the second gate electrode having a top surface free of dishing, wherein the second dielectric layer is further arranged over the second gate electrode and the third and fourth source/drain regions; and a second conductive contact extending through the second dielectric layer to the second gate electrode.

3. The semiconductor device of claim 2, further including:
a contact opening having opposing sidewall surfaces that are defined by the second dielectric and that are arranged directly over the second gate electrode, and wherein the contact opening is configured to expose a surface of the second gate electrode, without exposing the third and fourth source/drain regions; and
a second contact opening configured to expose a surface of the gate electrode and the first source/drain region, without exposing the second source/drain region, wherein a first sidewall surface of the second contact opening is defined by the second dielectric layer and is arranged directly over the gate electrode, and wherein a second sidewall surface of the second contact opening is defined by the first and second dielectric layers, is arranged at an edge of the first source/drain region, and opposes the first sidewall surface.

4. The semiconductor device of claim 2, further including:
a shallow trench isolation (STI) region arranged between the first and second doped well regions.

5. The semiconductor device of claim 1, further including:
a contact opening configured to expose a surface of the gate electrode and the first source/drain region, without exposing the second source/drain region, wherein a first sidewall surface of the contact opening is defined by the second dielectric layer and is arranged directly over the gate electrode, wherein a second sidewall surface of the contact opening is defined by the first and second dielectric layers, is arranged at an edge of the first source/drain region, and opposes the first sidewall surface, and wherein the contact opening extends continuously from the first sidewall surface to the second sidewall surface.

6. The semiconductor device of claim 1, further including:
a contact opening extending through the first and second dielectric layers to the first source/drain region, wherein the conductive contact is arranged within the contact opening, and wherein sidewalls of the conductive contact extend along sidewalls of the contact opening without an intervening polymeric etch residue.

7. The semiconductor device of claim 2, wherein the bottom surface of the second dielectric layer contacts the third and fourth source/drain regions, and
wherein the bottom surface of the second dielectric layer contacts the second strain inducing region, but not the first strain inducing region.

8. The semiconductor device according to claim 7, further comprising:
a pair of sidewall spacers respectively contacting two sidewall surfaces of the gate electrode, wherein the two sidewall surfaces of the gate electrode are on opposite sides of the gate electrode, wherein top surfaces respectively of the sidewall spacers are even with the top surface of the gate electrode, and wherein the sidewall spacers respectively overlie the first and second source/drain regions.

9. The semiconductor device according to claim 1, wherein the top surface of the first strain inducing region is even with a top surface of the substrate.

10. A semiconductor device comprising:
a substrate having a first source/drain region laterally spaced from a second source/drain region on opposing sides of a channel region;
a gate electrode arranged over the channel region and having a top surface free of pits;
a dielectric layer arranged over the gate electrode and the first and second source/drain regions;
a contact opening arranged in the dielectric layer and comprising a pair of opposing sidewall surfaces defined by the dielectric layer, wherein a first sidewall surface of the pair is arranged directly over the gate electrode, wherein a second sidewall surface of the pair is arranged at an edge of the first source/drain region, and wherein the contact opening extends continuously from the first sidewall surface to the second sidewall surface; and
a conductive contact extending through the dielectric layer to the first source/drain region and electrically coupled to the first source/drain region without intervening polymeric etch residue.

11. The semiconductor device of claim 10, wherein the contact opening is configured to expose a surface of the gate electrode and the first source/drain region, without exposing the second source/drain region.

12. The semiconductor device of claim 10, wherein the substrate includes a first doped well region neighboring a second doped well region with a different doping type than the first doped well region, wherein the first and second source/drain regions are arranged in the first doped well region, and wherein the semiconductor device further includes:
a third source/drain region laterally spaced from a fourth source/drain region in the second doped well region on opposing sides of a second channel region;
a second gate electrode arranged over the second channel region, the second gate electrode having a top surface free of pits, wherein the dielectric layer is further arranged over the second gate electrode and the third and fourth source/drain regions; and
a second conductive contact extending through the dielectric layer to the second gate electrode.

13. The semiconductor device of claim 12, further including:
a second contact opening configured to expose a surface of the second gate electrode, without exposing the third and fourth source/drain regions, wherein opposing sidewall surfaces of the second contact opening are defined by the dielectric layer and are arranged directly over the second gate electrode.

14. The semiconductor device of claim 12, wherein the dielectric layer is arranged over and contacts the third and fourth source/drain regions without intervening strain inducing regions, and wherein the semiconductor device further includes:
a strain inducing region arranged over and contacting the second source/drain region, and further arranged under and contacting the dielectric layer.

15. A semiconductor device comprising:
a semiconductor substrate having a p-type doped region neighboring an n-type doped region;
a first source/drain region laterally spaced from a second source/drain region in the p-type doped region on opposing sides of a first channel region;
a third source/drain region laterally spaced from a fourth source/drain region in the n-type doped region on opposing sides of a second channel region;
a first gate electrode and a second gate electrode respectively arranged over the first and second channel regions, the first and second gate electrodes having top surfaces free of pits;
a dielectric layer arranged over the first and second gate electrodes and the first, second, third, and fourth source/drain regions, wherein the dielectric layer contacts the first source/drain region continuously, and without an intervening strain inducing region, from a first side of the first source/drain region to a second side of the first source/drain region that is opposite the first side;
a conductive contact extending through the dielectric layer to the third source/drain region and electrically coupled to the third source/drain region without intervening polymeric etch residue; and
a strain inducing region arranged over and contacting the fourth source/drain region, and further arranged under and contacting the dielectric layer.

16. The semiconductor device of claim 15, wherein the conductive contact is laterally spaced from the second gate electrode without intervening polymeric etch residue.

17. The semiconductor device of claim 15, further including:
a first contact opening configured to expose a surface of the first gate electrode, without exposing the first and second source/drain regions, wherein opposing sidewall surfaces of the first contact opening are defined by the dielectric layer and are arranged directly over the first gate electrode; and
a second contact opening configured to expose a surface of the second gate electrode and the third source/drain region, without exposing the fourth source/drain region, wherein a first sidewall surface of the second contact opening is arranged directly over the second gate electrode, wherein a second sidewall surface of the second contact opening is arranged at an edge of the third source/drain region and opposes the first sidewall surface, and wherein the first and second sidewall surfaces are defined by the dielectric layer.

18. The semiconductor device of claim 15, further comprising:
a second strain inducing region arranged over and contacting the third source/drain region, wherein a top surface of the second strain inducing region is even with a top surface of the semiconductor substrate, wherein a top surface of the strain inducing region is spaced over the top surface of the second strain inducing region, and wherein bottom surfaces respectively of the strain inducing region and the second strain inducing region are spaced below the top surface of the semiconductor substrate.

19. The semiconductor device according to claim 15, wherein the dielectric layer includes a first dielectric sublayer and a second dielectric sublayer, wherein the first dielectric sublayer is over the semiconductor substrate and has a top surface approximately coplanar with the top surfaces of the first and second gate electrodes, wherein the second dielectric sublayer is over the first dielectric sublayer and has a bottom surface below the top surfaces of the first and second gate electrodes, and wherein the second dielectric sublayer has a cross-sectional profile with a trio of discrete, T-shaped segments respectively overhanging the first and second gate electrodes.

20. The semiconductor device according to claim 19, wherein the trio of discrete, T-shaped segments comprises a first segment, a second segment, and a third segment, wherein the first segment covers the first source/drain region and overhangs the first gate electrode, wherein the second segment covers the second source/drain region and overhangs the first gate electrode, and wherein the third segment covers the fourth source/drain region and overhangs the second gate electrode.

* * * * *